United States Patent
Hayashi

(10) Patent No.: US 7,109,469 B2
(45) Date of Patent: Sep. 19, 2006

(54) COMPOSITE OPERATION TYPE INPUT DEVICE FOR CARRYING OUT PRESSING AND ROTATION OPERATIONS WITH COMMON OPERATION UNIT

(75) Inventor: Yukiharu Hayashi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 69 days.

(21) Appl. No.: 10/641,927

(22) Filed: Aug. 14, 2003

(65) Prior Publication Data

US 2005/0072910 A1 Apr. 7, 2005

(30) Foreign Application Priority Data

Aug. 27, 2002 (JP) ............................. 2002-247040

(51) Int. Cl.
*G01D 5/34* (2006.01)
*H01H 19/14* (2006.01)

(52) U.S. Cl. ............... 250/221; 250/231.1; 250/231.13; 200/61.27; 200/564; 345/157

(58) Field of Classification Search ................ 250/221, 250/231.1, 231.13, 231.14, 231.16; 200/61.27, 200/61.34, 61.39, 293, 564–570; 345/157, 345/158, 165, 167
See application file for complete search history.

(56) References Cited

U.S. PATENT DOCUMENTS

| 4,575,600 A | * | 3/1986 | Botz et al. .................. 200/293 |
| 4,859,922 A | | 8/1989 | Tauchenitz et al. |
| 5,223,864 A | | 6/1993 | Twisselmann |
| 6,080,942 A | * | 6/2000 | Sasaki ....................... 200/17 R |
| 6,380,733 B1 | | 4/2002 | Apel et al. |

FOREIGN PATENT DOCUMENTS

| DE | 32 36 531 | 4/1984 |
| DE | 44 32 399 | 3/1986 |
| JP | 2002-025395 | 1/2002 |

\* cited by examiner

*Primary Examiner*—Kevin Pyo
(74) *Attorney, Agent, or Firm*—Brinks Hofer Gilson & Lione

(57) ABSTRACT

A code disc is spline-connected to an operation unit supported such that it can rotate and move vertically and sandwiched between a center cylinder and a return spring. Rotation of the operation unit is detected by photointerruptors through the code disc and vertical movement of the operation unit is detected by a photointerruptor through a cylinder.

20 Claims, 5 Drawing Sheets

COMPOSITE OPERATION TYPE INPUT DEVICE FOR CARRYING OUT PRESSING AND ROTATION OPERATIONS WITH COMMON OPERATION UNIT

BACKGROUND OF THE INVENTION

1. Field of the Invention

The present invention relates to a composite operation type input device which is capable of carrying out an input operation with two different pressing and rotation operations.

2. Description of the Related Art

Heretofore, as an example of this type of composite operation type input device, there has been known a device which comprises a rotary operation unit having an annular rotary knob, a slider which is rotated by this rotary knob, a printed board having a contact point pattern in sliding contact with this slider, a pressing operating unit having an operation shaft which can move vertically on the inner side in the radial direction of the rotary knob, and a push switch which is pressed by an end of this operation shaft and mounted on the printed board.

In the composite operation type input device which is constituted as described above, when an operator rotates the rotary knob, the slider rotates together with the rotary knob and moves the contact point pattern on the printed board, whereby a rotation operation detection signal corresponding to the contact position between the slider and the contact point pattern is output. When the operator presses down the operation shaft by a predetermined stroke, the actuator of the push switch is pressed down by the end of the operation shaft, whereby a movable contact point incorporated in the push switch contact a fixed contact point to output a pressing operation detection signal.

In the above conventional composite operation type input device, the rotation operation mechanism including the rotary knob and the pressing operation mechanism including the operating shaft are separated from each other so that they can act independently without interfering with each other. However, when these two independent operation units are installed adjacent to each other in a limited space, the resulting structure becomes complicated, thereby making it difficult to cut the cost. Further, since a part to be rotated is mounted around a part to be pressed, it is difficult to prevent an increase in the diameter of the rotation operation mechanism with the result that the whole device becomes large in size. Further, when the rotation operation is repeated, the contact sites of the slider and the contact point pattern gradually wear away, thereby making it difficult to maintain desired detection accuracy for a long time.

SUMMARY OF THE INVENTION

It is an object of the present invention which has been made in view of the above situation of the prior art to provide an inexpensive composite operation type input device which has a long service life and is easily reduced in size.

To attain the above object, the composite operation type input device of the present invention comprises an operation unit supported in such a manner that it can rotate and move vertically, a rotary member which rotates together with the operation unit, rotation operation detection means for detecting rotation operation of the operation unit through the rotary member and pressing operation detection means for detecting vertical movement of the above operation unit, and the rotation operation detection means are made up of detection elements (for example, photointerruptors) which do not contact the detected portions of the rotary member.

When rotation operation and pressing operation are carried out with a common operation unit, the whole structure is simplified and the whole device is easily reduced in size. Since the rotation operation detection means are detection elements which do not contact the detected portions, even when rotation operation is repeated, a reduction in detection accuracy caused by abrasion does not occur and high reliability can be maintained for a long time.

In the above constitution, in the case of a composite operation type input device in which the above pressing operation detection means is made up of a detection element (for example, photointerruptor) which does not contact a detected vertical moving portion integrated with the operation unit, undesired stress caused by pressing operation force is not applied to the detection means, whereby a reduction in detection accuracy does not occur even when pressing operation is repeated and high reliability can be maintained for a long time.

In the case of a composite operation type input device in which the rotary member is spline-connected to the operation unit and regulating means for preventing vertical movement of the rotary member is provided in addition to any one of the above constitutions, since the rotary member does not move vertically during pressing operation, a circuit board can be installed at a position opposed to the rotary member in an axial direction, and the above rotation operation detection means and the above pressing operation detection means can be mounted on the circuit board easily. For example, when the rotary member is a code disc which is spline-connected to the operation unit and the regulating means comprises a regulating member for rotatably supporting the code disc and a spring member for elastically urging the code disc against the regulating member, the code disc does not move vertically during pressing operation and the spring member can function as a return spring for the operation unit.

In a composite operation type input device having a click unit for generating a click sensation along with the rotation of the operation unit in addition to any one of the above constitutions, since the rotation of the operation unit during rotation operation can be known from a click sensation, operation efficiency is improved. The above click unit is preferably such that drivers which are held in the operation unit and elastically urged outward in a radial direction are provided, click engagement portions made up of grooves are continuously formed in an inner wall of a case for storing the operation unit so that the drivers are disengaged from the grooves by the rotation of the operation unit.

DESCRIPTION OF THE PREFERRED EMBODIMENTS

Figure 1:
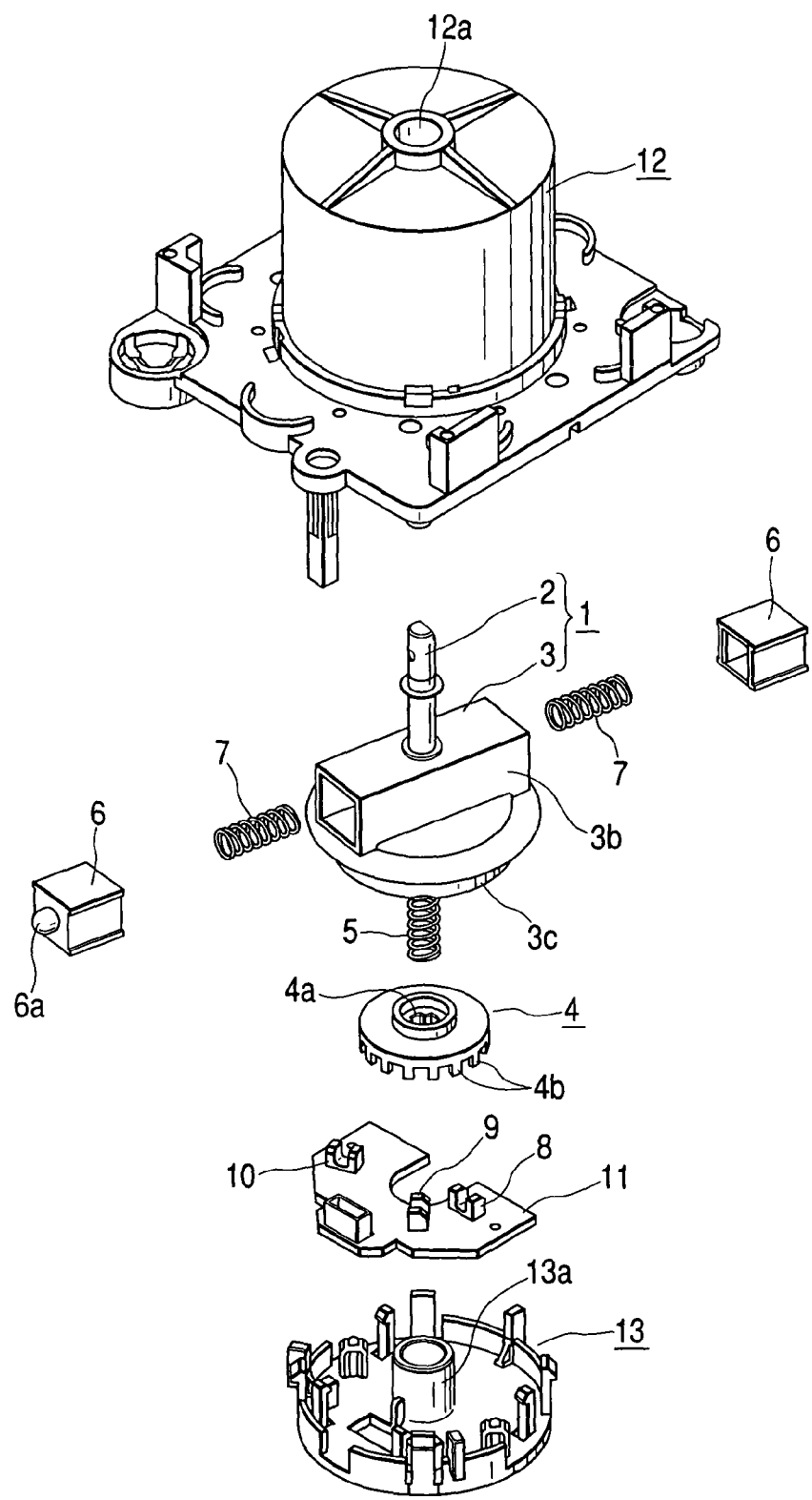
FIG. 1 is an exploded perspective view of a composite operation type input device according to an embodiment of the present invention.
Figure 2:
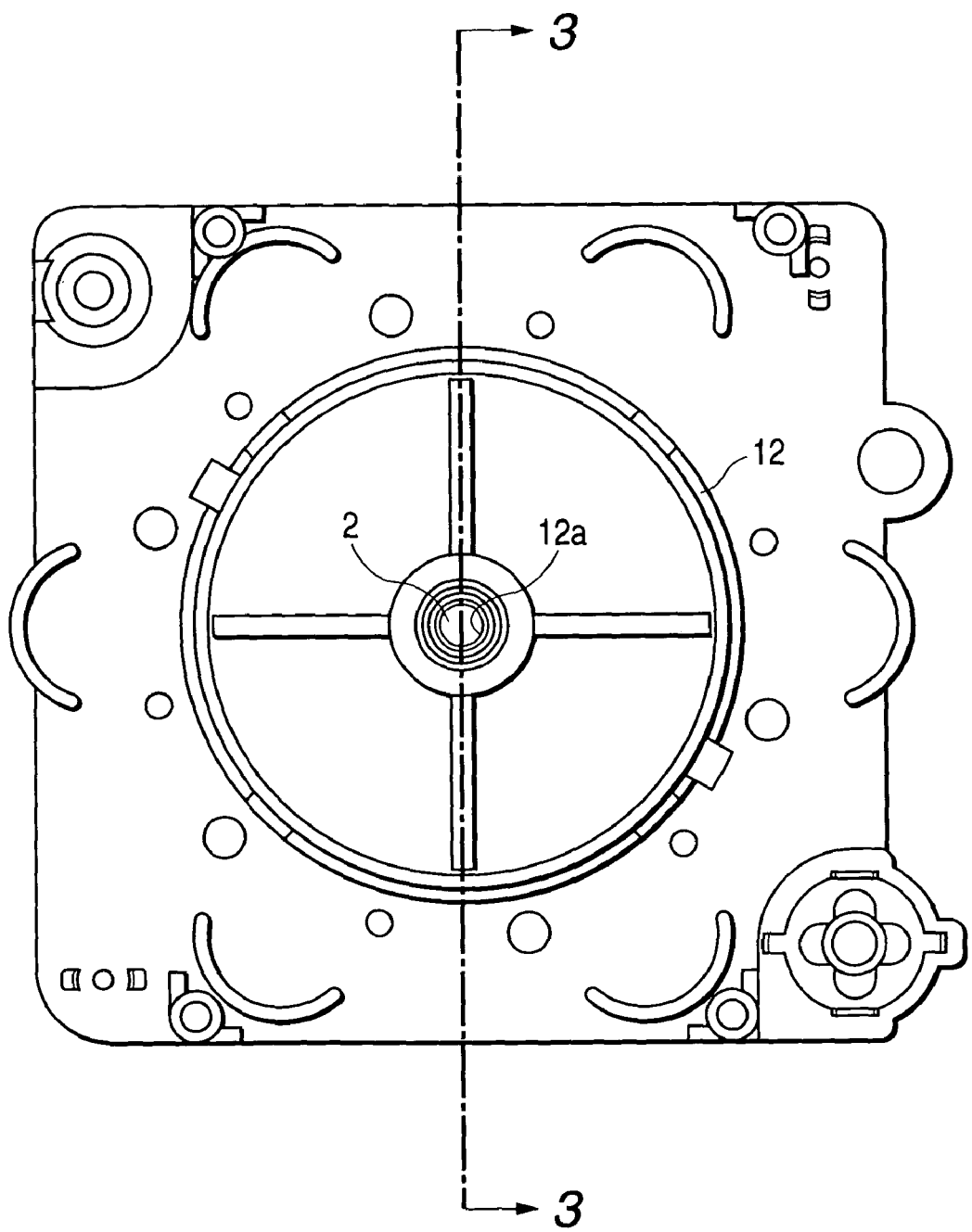
FIG. 2 is a plan view of the input device.
Figure 4:
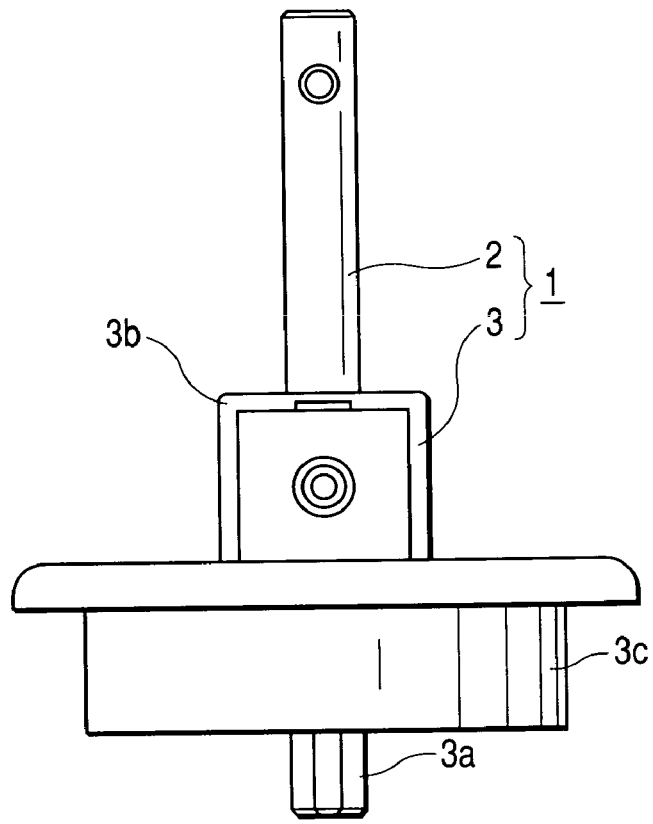
FIG. 4 is a side view of the operation unit of the input device.
Figure 5:
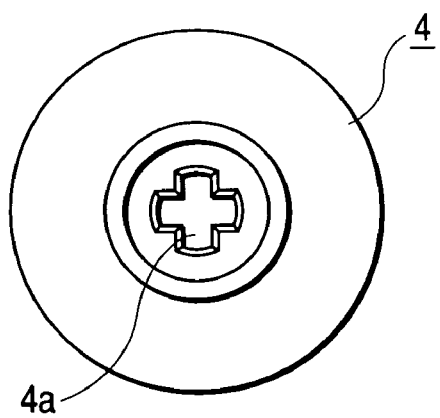
FIG. 5 is a plan view of the code disc of the input device.
Figure 6:
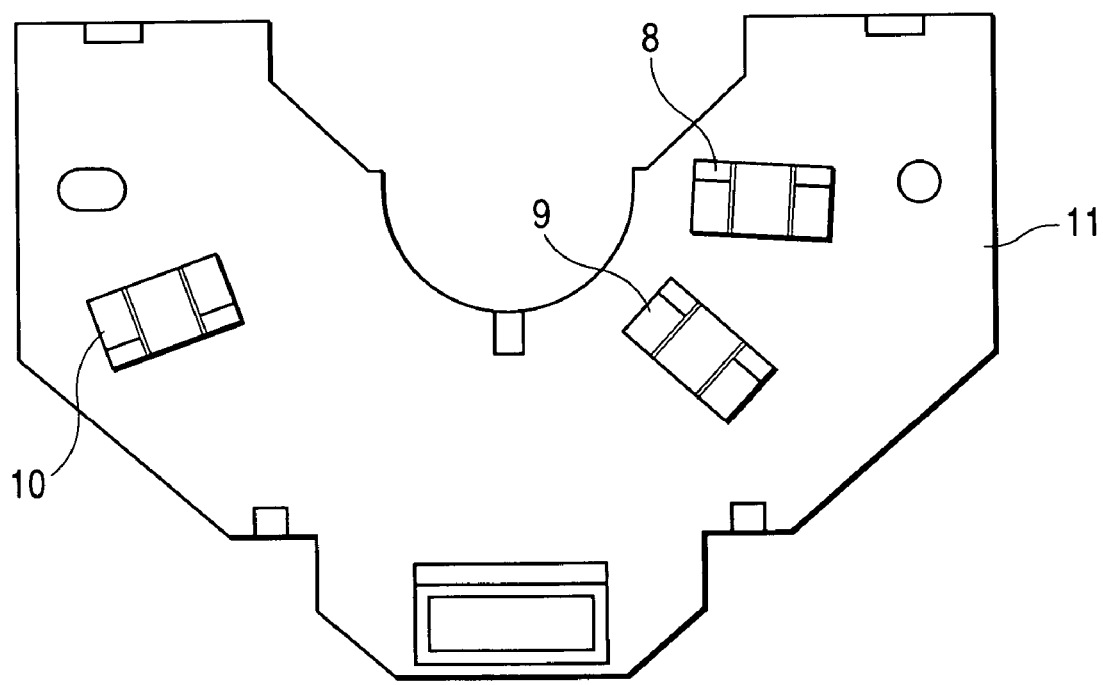
FIG. 6 is a plan view of the circuit board of the input device.

A preferred embodiment of the present invention will be described with reference to the accompanying drawings. FIG. 1 is an exploded perspective view of a composite operation type input device according to an embodiment of the present invention, FIG. 2 is a plan view of the input device, FIG. 3 is a sectional view cut on line 3—3 of FIG. 2, FIG. 4 is a side view of the operation unit of the input device, FIG. 5 is a plan view of the code disc of the input device, and FIG. 6 is a plan view of the circuit board of the input device.

The composite operation type input device shown in these figures comprises an operation unit 1 which includes an upper shaft 2 and a lower driver 3 integrally and is supported such that they can rotate and move vertically, a code disc 4 which is spline-connected to the shaft 3a of the lower driver 3, a return spring 5 which elastically urges the code disc 4 downward along the shaft 3a, a pair of drivers 6 held in the square cylinder 3b of the lower driver 3, a pair of compression springs 7 which elastically urge the drivers 6 outward in a radial direction, photointerruptors 8, 9 and 10 each made up of a combination of a light emitting device and a photodetector, a circuit board 11 which mounts these photointerruptors 8 to 10, a case 12 which houses the lower driver 3, the code disc 4, the circuit board 11 and the like, and a holder 13 which mounts the circuit board 11 and then is installed in the opening at a lower end of the case 12.

Figure 3:
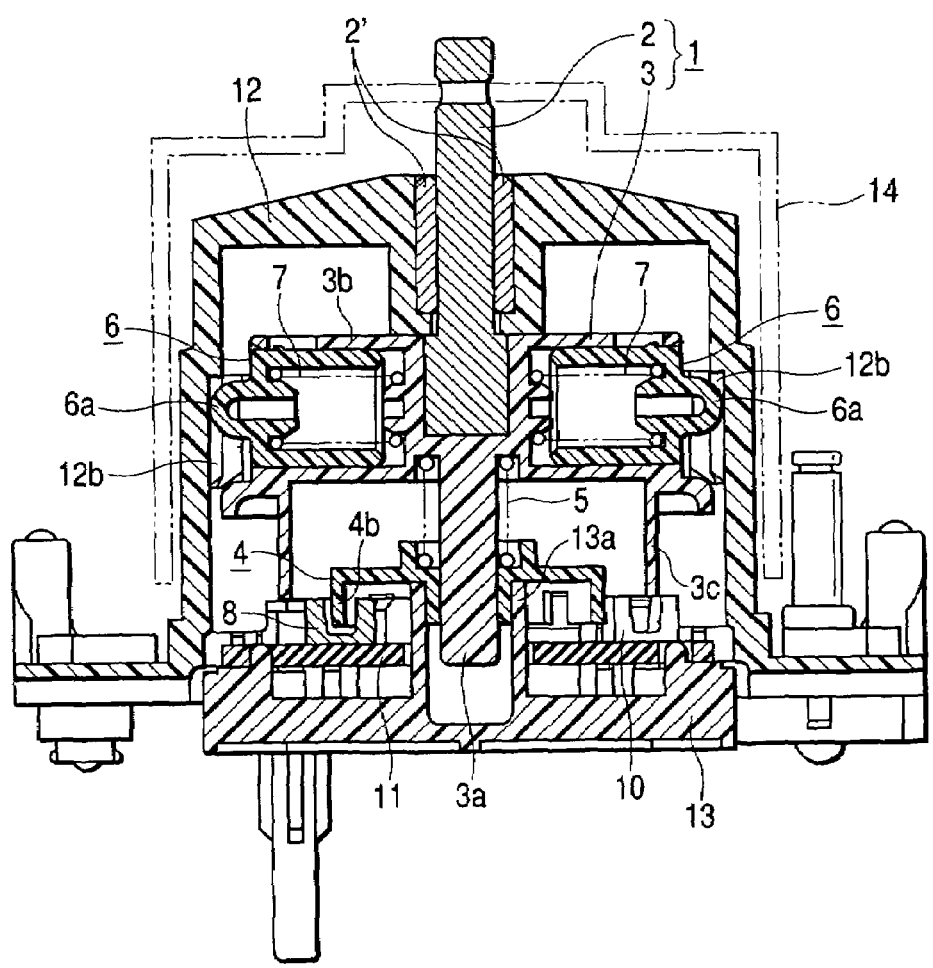
FIG. 3 is a sectional view cut on line 3—3 of FIG. 2.

In the operation unit 1, the lower end of the upper shaft 2 and the square cylinder 3b of the lower driver 3 are fixed to each other by press-fitting, the upper end of the upper shaft 2 projects upward from the center hole 12a of the case 12, and an operation knob 14 is mounted to this upper end (see FIG. 3). A cylinder 3c is formed on the lower driver 3 of the operation unit 1 in such a manner that it surrounds the shaft 3a. When the operation unit 1 is lowered by a predetermined stroke, the cylinder 3c cuts off the optical path of the photointerruptor 10. The shaft 3a of the operation unit 1 has a cross-like sectional form, and a cross hole 4a having substantially the same form as the shaft 3a is formed in the center portion of the code disc 4 spline-connected to the shaft 3a (see FIG. 5). Therefore, the code disc 4 rotates together with the operation unit 1. The code disc 4 is fitted onto the center cylinder 13a of the holder 13 and is elastically urged toward the center cylinder 13a by the return spring 5 from above. Therefore, even when the operation unit 1 moves vertically, the code disc 4 does not move vertically. Comb-like detected portions 4b are formed at the periphery of the code disc 4 in a circumferential direction at equal intervals and cut off the optical paths of the photointerruptors 8 and 9 according to the rotation position of the code disc 4. As shown in FIG. 3, click engagement portions made up of grooves 12b are formed continuously in the inner wall of the case 12 in a circumferential direction and the end projections 6a of the drivers 6 are elastically contacted to the click engagement portions. Thereby, when the operation unit 1 is rotated, each driver 6 is disengaged from the groove 12b to generate a click sensation.

In the thus constituted composite operation type input device, when the operator rotates the operation unit 1 with the operation knob 14, the code disc 4 rotates together with the operation unit 1, whereby the optical paths of the photointerruptors 8 and 9 are cut off by the comb-like detected portions 4b. That is, since a signal corresponding to the rotation position of the code disc 4 is output from the photointerruptors 8 and 9, the rotation operation (rotation angle and rotation operation direction) of the operation unit 1 can be detected from this signal. At the time of the rotation operation, the pair of drivers 6 held in the square cylinder 3b of the operation unit 1 are disengaged from the grooves 12 in the inner wall of the case 12 to generate a click sensation, whereby the operator can know the rotation amount of the operation unit 1 from this click sensation.

When the operator carries out a pressing operation for pressing down the operation unit 1 with the operation knob 14, the operation unit 1 lowers while compressing the return spring 5 and when the operation unit 1 lowers by a predetermined stroke, the cylinder 3c cuts off the optical path of the photointerruptor 10. Therefore, the downward movement of the operation unit 1 can be detected from the fact that the output of the photointerruptor 10 has been cut off. As the code disc 4 is prevented by the center cylinder 13a from moving down, the relative position relationship between the detected portions 4b and the photointerruptors 8 and 9 does not change. When pressing operation force for pressing down the operation unit 1 is removed while the optical path of the photointerruptor 10 is cut off by the cylinder 3c, the operation unit 1 is moved up to its initial position by the restoration force of the return spring 5, whereby the cylinder 3c rises and the optical path of the photointerruptor 10 is not cut off any longer. Therefore, the upward movement of the operation unit 1 can be detected from the fact that the output of the photointerruptor 10 has been restored.

The composite operation type input device according to this embodiment is constituted such that the common operation unit 1 is used for both rotation operation and pressing operation, the photointerruptors 8 and 9 detect the rotation of the operation unit 1 through the code disc 4 at the time of rotation operation, and the photointerruptor 10 detects the vertical movement of the operation unit 1 through the cylinder 3c at the time of pressing operation. Therefore, the whole structure can be simplified, the cost can be easily cut, and the whole device can be easily reduced in size by controlling its size in the radical direction. In this embodiment, means of detecting rotation operation are photointerruptors 8 and 9 which are optical sensors and a reduction in detection accuracy caused by abrasion or the like does not occur because the photointerruptors 8 and 9 never contact the detected portions 4b even when the rotation operation is repeated, thereby making it possible to obtain a high-accuracy rotation detection signal for a long time. Similarly, in this embodiment, means of detecting pressing operation is the photointerruptor 10 which is an optical sensor and undesired stress caused by pressing operation force is not applied to the photointerruptor 10 even when the pressing operation is repeated, thereby making it possible to obtain a high-accuracy vertical movement detection signal for a long time.

Although the photointerruptors 8 to 10 are used as means of detecting rotation operation and pressing operation in the above embodiment, even when another detection element which does not contact the detected unit, such as a photoreflector (optical sensor) or Hall element (magnetic sensor) is used, its service life can be extended as well. When photointerruptors are used, the detected unit can be produced at a low cost, which is economically advantageous. Since there is no need of apprehension of a reduction in detection accuracy caused by abrasion in the case of pressing operation, a push switch may be used as the pressing operation detection means.

In the above embodiment, the drivers 6 held in the rectangular cylinder 3b of the operation unit 1 are disengaged from the grooves 12b of the case 12 to generate a click sensation. Elastic pieces may be provided on the case and disengaged from grooves formed in the operation unit to generate a click sensation. Further, a click unit for generating a click sensation at the time of pressing operation may be provided.

The present invention is carried out as described above and has the following effects.

Since the composite operation type input device carries out rotation operation and pressing operation with the common operation unit, the structure of the device is simple, the production cost of the device can be easily cut, and the whole device can be easily reduced in size. Since the rotation operation detection means are detection elements which do not contact the detected unit, even when rotation operation is repeated, a reduction in detection accuracy caused by abrasion or the like does not occur, thereby making it possible to maintain high reliability for a long time.

When the pressing operation detection means is a detection element which does not contact the detected vertical moving portion integrated with the operation unit, undesired stress caused by pressing operation force is not applied to the detection means, thereby making it possible to further extend the service life of the device.

What is claimed is:

1. A composite operation type in put device comprising:
    an operation unit supported such that the operation unit is rotatable and vertically movable;
    a cylinder disposed parallel to the vertical direction of motion of the operation unit, the cylinder communicating with the operation unit;
    a rotary member which rotates together with the operation unit;
    a detection element that detects rotation of the operation unit through the rotary member and does not contact detected portions of the rotary member;
    regulating means for inhibiting vertical movement of the rotary member; and
    pressing operation detector that detects a vertical motion of the cylinder,
    wherein the rotary member is spline-connected to a shaft of the operation unit, and the regulating means comprises a regulating member for rotatably supporting the rotary member, a spring for elastically urging the rotary member against the regulating member and for moving the operating unit, and the spring functions as a return spring.

2. The composite operation type input device according to claim 1, wherein the pressing operation detector does not contact the cylinder.

3. The composite operation type input device according to claim 1, wherein the rotary member is a code disc.

4. The composite operation type input device according to claim 3, wherein the detection element is a photointerruptor.

5. The composite operation type input device according to claim 1 which further comprises a click mechanism for generating a click sensation along with the rotation of the operation unit.

6. The composite operation type input device according to claim 5, wherein the click mechanism comprises drivers which are held in the operation unit and elastically urged outward in a radial direction and click engagement portions which are grooves continuously formed in an inner wall of a case for storing the operation unit so that the drivers are disengaged from the grooves along with the rotation of the operation unit.

7. The composite operation type input device according to claim 1, wherein the detection element is a photointerruptor.

8. The composite operation type input device according to claim 2 which further comprises a click mechanism for generating a click sensation along with the rotation of the operation unit.

9. The composite operation type input device according to claim 1 which further comprises a click mechanism for generating a click sensation along with the rotation of the operation unit.

10. The composite operation type input device according to claim 3 which further comprises a click mechanism for generating a click sensation along with the rotation of the operation unit.

11. The composite operation type input device according to claim 4 which further comprises a click mechanism for generating a click sensation along with the rotation of the operation unit.

12. The composite operation type input device according to claim 7 which further comprises a click mechanism for generating a click sensation along with the rotation of the operation unit.

13. The composite operation type input device according to claim 8, wherein the click mechanism comprises a driver which is held in the operation unit and elastically urged outward in a radial direction and click engagement portions which are grooves continuously formed in an inner wall of a case for storing the operation unit so that the drivers are disengaged from the grooves along with the rotation of the operation unit.

14. The composite operation type input device according to claim 9, wherein the click mechanism comprises drivers which are held in the operation unit and elastically urged outward in a radial direction and click engagement portions which are grooves continuously formed in an inner wall of a case for storing the operation unit so that the drivers are disengaged from the grooves along with the rotation of the operation unit.

15. The composite operation type input device according to claim 10, wherein the click mechanism comprises drivers which are held in the operation unit and elastically urged outward in a radial direction and click engagement portions which are grooves continuously formed in an inner wall of a case for storing the operation unit so that the drivers are disengaged from the grooves along with the rotation of the operation unit.

16. The composite operation type input device according to claim 11, wherein the click mechanism comprises drivers which are held in the operation unit and elastically urged outward in a radial direction and click engagement portions which are grooves continuously formed in an inner wall of a case for storing the operation unit so that the drivers are disengaged from the grooves along with the rotation of the operation unit.

17. The composite operation type input device according to claim 12, wherein the click mechanism comprises drivers which are held in the operation unit and elastically urged outward in a radial direction and click engagement portions which are grooves continuously formed in an inner wall of a case for storing the operation unit so that the drivers are disengaged from the grooves along with the rotation of the operation unit.

18. The composite operation type input device according to claim 1, wherein the first detection element and the pressing operation detector are mounted to a printed circuit board.

19. The composite operation type input device according to claim 1, wherein the cylinder is disposed on the operation unit such that the cylinder is concentric with operation unit.

20. The composite operation type input device according to claim 19, wherein the rotary member has comb teeth.

* * * * *